United States Patent
Volkenandt et al.

(10) Patent No.: US 8,259,392 B2
(45) Date of Patent: Sep. 4, 2012

(54) METHOD OF PRODUCING A DIFFRACTIVE OPTICAL ELEMENT AND DIFFRACTIVE OPTICAL ELEMENT PRODUCED BY SUCH A METHOD

(75) Inventors: Harald Volkenandt, Aalen (DE); Gundula Weiss, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1162 days.

(21) Appl. No.: 12/030,646

(22) Filed: Feb. 13, 2008

(65) Prior Publication Data

US 2008/0192223 A1   Aug. 14, 2008

Related U.S. Application Data

(60) Provisional application No. 60/889,787, filed on Feb. 14, 2007.

(30) Foreign Application Priority Data

Feb. 14, 2007   (DE) .................. 10 2007 007 907

(51) Int. Cl.
   *G02B 5/30*   (2006.01)
(52) U.S. Cl. .............. 359/492.01; 359/493.01; 359/558; 359/352
(58) Field of Classification Search .................. None
   See application file for complete search history.

(56) References Cited

U.S. PATENT DOCUMENTS

| | | | |
|---|---|---|---|
| 4,994,139 A | 2/1991 | Biermann et al. | |
| 5,343,489 A | 8/1994 | Wangler | |
| 6,055,103 A * | 4/2000 | Woodgate et al. | ....... 359/489.07 |
| 6,084,708 A | 7/2000 | Schuster | |
| 6,150,060 A | 11/2000 | Vernon | |
| 6,236,439 B1 | 5/2001 | Saiki et al. | |
| 6,310,679 B1 | 10/2001 | Shiraishi | |
| 6,417,974 B1 | 7/2002 | Schuster | |
| 6,451,462 B1 | 9/2002 | Schuster | |
| 6,580,172 B2 | 6/2003 | Mancini et al. | |
| 6,867,923 B2 | 3/2005 | Singer et al. | |
| 7,053,988 B2 * | 5/2006 | Totzeck et al. | ................ 355/71 |
| 7,630,133 B2 * | 12/2009 | Perkins | ............ 359/485.05 |
| 7,800,823 B2 * | 9/2010 | Perkins | ............ 359/485.05 |
| 2001/0028518 A1 | 10/2001 | Kaiser | |
| 2002/0176166 A1 * | 11/2002 | Schuster | .................. 359/494 |
| 2004/0021843 A1 | 2/2004 | Dieckmann et al. | |
| 2004/0257553 A1 | 12/2004 | Totzeck | |

(Continued)

FOREIGN PATENT DOCUMENTS

DE   30 35 025 A1   4/1981

(Continued)

OTHER PUBLICATIONS

German Examination Report, with English translation, for counterpart DE Application No. 10 2007 007 907.0, dated Oct. 16, 2007.

(Continued)

*Primary Examiner* — Derek S Chapel
(74) *Attorney, Agent, or Firm* — Fish & Richardson P.C.

(57) ABSTRACT

A microlithography projection exposure system has an illumination system with an illumination optical system. The latter can have at least one diffractive optical element, which is divided into multiple adjacently arranged individual elements, each of which has one specified bundle-forming and polarizing effect.

13 Claims, 3 Drawing Sheets

U.S. PATENT DOCUMENTS

| | | |
|---|---|---|
| 2005/0117203 A1 | 6/2005 | Dieckmann et al. |
| 2005/0146704 A1* | 7/2005 | Gruner et al. .............. 355/71 |
| 2006/0028957 A1 | 2/2006 | Kim |
| 2006/0158624 A1 | 7/2006 | Toyoda |

FOREIGN PATENT DOCUMENTS

| | | |
|---|---|---|
| DE | 41 24 311 | 1/1993 |
| DE | 198 30 449 | 1/2000 |
| DE | 101 19 861 | 11/2001 |
| DE | 102 20 045 | 11/2003 |
| DE | 102 60 819 A1 | 7/2004 |
| DE | 103 21 598 A1 | 12/2004 |
| EP | 0 921 418 B1 | 6/1999 |
| GB | 2 088 078 | 6/1982 |
| WO | WO 03/093880 | 11/2003 |
| WO | WO 2004/102273 | 11/2004 |

OTHER PUBLICATIONS

European Office Action, with English translation, for corresponding EP Appl No. 08 002 449.0, dated Feb. 28, 2012.

* cited by examiner

METHOD OF PRODUCING A DIFFRACTIVE OPTICAL ELEMENT AND DIFFRACTIVE OPTICAL ELEMENT PRODUCED BY SUCH A METHOD

CROSS-REFERENCE TO RELATED APPLICATIONS

This application claims priority under 35 U.S.C. §119 to German patent application serial number 10 2007 007 907.0, filed Feb. 14, 2007, which is hereby incorporated by reference. This application also claims priority under 35 U.S.C. §119(e)(1) to U.S. provisional patent application 60/889,787, filed Feb. 14, 2007, which is hereby incorporated by reference.

FIELD

The disclosure concerns a method of producing a diffractive optical element. The disclosure also concerns a diffractive optical element which is produced by such a method, and an illumination optical system which uses at least one such diffractive optical element. The disclosure also concerns a microlithography projection exposure system with such an illumination optical system, and a method of producing a micro-electronic component using such a projection exposure system.

BACKGROUND

Diffractive optical elements for use in a projection objective for microlithography, components for polarization control within a projection optical system of a projection exposure system, etching methods for producing diffractive optical elements, the use of doubly refracting elements with sections of different doubly refracting effect distributed over their optical surface, and optical components with doubly refracting layers are known.

It is also known to use diffractive optical elements within a microlithography projection exposure system, in particular to specify an illumination setting, i.e. a defined illumination angle distribution to illuminate the reticle.

SUMMARY

In one aspect, the disclosure features a method that includes producing an optical raw element from a substrate of an optically polarization-active material, and removing material from the optical raw element to provide a diffractive optical element which is divided into multiple adjacently arranged individual elements. Each of the individual elements has one specified bundle-forming and polarizing effect out of multiple specified bundle-forming and polarizing effects.

In another aspect, the disclosure features a diffractive optical element produced according to the method described in the preceding paragraph.

In a further aspect, the disclosure features an illumination optical system that includes at least one diffractive optical element as described in the preceding paragraph.

In an additional aspect, the disclosure features a microlithography projection exposure system that includes an illumination optical system as described in the preceding paragraph.

In another aspect, the disclosure features a method that includes using the microlithography projection exposure system described in the preceding paragraph to form a micro-electronic component.

In a further aspect, the disclosure features a method that includes providing an optical raw material including a bundle formation substrate and a polarization formation substrate, and removing portions of the polarization formation substrate to provide a diffractive optical element that is divided into multiple adjacently arranged individual elements. Each of the individual elements has a bundle-forming effect and a polarizing effect.

In an additional aspect, the disclosure features a diffractive optical article that includes a substrate including an optically homogeneous material. The substrate has first regions and second regions. The article also includes a plurality of polarization grid sections including an optically polarization-active material, each polarization grid section being supported by a corresponding second region of the substrate.

In another aspect, the disclosure features an illumination optical system that includes at least one diffractive optical element as described in the pre-ceding paragraph.

In a further aspect, the disclosure features a microlithography projection exposure system that includes an illumination optical system as described in the preceding paragraph.

In another aspect, the disclosure features a diffractive optical element that includes a unitary piece including optically polarization-active material, the unitary piece including first regions, second regions, and a plurality of polarization grid sections. Each polarization grid section is supported by a corresponding second region of the substrate.

In a further aspect, the disclosure features an illumination optical system that includes at least one diffractive optical element as described in the pre-ceding paragraph.

In an additional aspect, the disclosure features a microlithography projection exposure system that includes an illumination optical system as de-scribed in the preceding paragraph.

In some embodiments, the disclosure provides a production method for a diffractive optical element in which at least two different types of individual elements with different specified bundle-forming and polarizing effect can be produced with high structural precision.

In some embodiments, the method includes:
  provision of at least one substrate of an optically polarization-active material,
  production of an optical raw element from the at least one provided substrate,
  subdivision of the raw element corresponding to the later individual elements, and
  removing material from the optical raw element at the location of the specified individual elements to a specified depth.

In certain embodiments, a substrate is prepared from an optically polarization-active material. One example of an optically polarization-active material is an optically doubly refracting material. Examples of doubly refracting materials are, for instance, crystalline quartz, magnesium fluoride or sapphire. Optically active materials also are polarization-active materials in the context of this application. Doubly refracting crystalline materials can also be optically active, as is known, for instance, about crystalline quartz. Whether the polarization-influencing effect of the material which is used occurs essentially through optical activity or through double refraction depends, for instance, on the alignment of the crystal axes of the crystal relative to the light propagation direction.

The optical raw element can be produced from this optically polarization-active material only, or by joining multiple substrates, of which at least one substrate is optically polarization-active. In some embodiments, the sections of the raw element which later form the individual elements with the appropriate bundle-forming and polarizing effect are marked. If the optical raw element is made from a single substrate, this substrate can be selectively etched. The regions of the optical raw element which have been etched, and thus have a different layer thickness from the other regions, can differ in their polarization optical effect from the other regions. The diffractive optical element can additionally have, to generate or support a bundle-forming effect of the individual elements, a diffractive optical component which is arranged at a distance from the optical raw element. The optical raw element can then have a purely polarizing effect at the location of the individual elements, without a bundle-forming effect. Alternatively, it is possible to distribute the bundle-forming effect of the individual elements to the optical raw element on the one hand, and the further diffractive optical component on the other hand. In this case, the distance of the diffractive optical element from the optical raw element can be less than 20 mm, such as less than 5 mm. The diffractive optical component can also be arranged in direct contact with the optical raw element.

In the case of the method, in which bundle-forming structures are applied in the optical raw element, this application being carried out corresponding to the specified subdivision of the optical raw element into the individual elements, each produced optical raw element at the location of the individual elements can have a specified bundle-forming and polarizing effect. If the bundle-forming effect of the produced optical raw element is sufficient, an additional, separate diffractive optical component is unnecessary.

Material removing can involve forming fins in the optical raw element, and then removing the fins to form the individual elements. This can result, for example, in individual elements with well defined edges, having only a slight deviation from the vertical. Unwanted stray light can be minimized at such edges.

Material removing imprecision caused in production can be avoided with the method, in which the optical raw element has a polarization formation substrate of the optically polarization-active material and a bundle formation substrate, in the production of the diffractive optical element the bundle formation substrate being optically polished on one joining side, the bundle formation substrate being joined to the polarization formation substrate to produce the optical raw element, bundle-forming structures being applied into at least one of the bundle formation substrate and the polarization formation substrate, this application taking place corresponding to the subdivision into the individual elements, and the layer thickness of the polarization formation substrate at the location of specified individual elements being removed as far as the polished joining side of the bundle formation substrate. This can avoid imprecision because the layer thickness of the profile formation substrate at the location of specified individual elements is removed completely, i.e. as far as the bundle formation substrate. The polished bundle formation substrate, the evenness of which corresponds to the desired depth tolerance, therefore reappears. In this way, diffractive optical elements with multiple types of individual elements with exactly defined bundle-forming and polarizing effect can be produced. Roughness or unevenness of etched surfaces does not matter with this method. For instance, a depth tolerance of +/−1.5 μm on the etched surfaces is achievable.

Matchingly thrusting the bundle formation substrate and the polarization formation substrate jointly together can avoid an adhesive layer between the bundle formation substrate and the polarization formation substrate. Therefore, after the complete, selective removal of the polarization formation substrate, no intermediate layer needs to be removed so that the polished side of the bundle formation substrate can be used.

Material removal by applying etch structures into the polarization formation substrate, and heating etch projecting ends between the etch structures until the polarization formation substrate is detached from the bundle formation substrate at the locations to be removed, so that the polished joining side of the bundle formation substrate at the location of the specified individual elements is uncovered, makes exact molding of the individual elements which are generated by uncovering possible, in particular with vertical edges between the uncovered individual elements and the individual elements which are adjacent to the uncovered individual elements.

Etch structures being applied along the periphery of the individual elements to be removed from the polarization formation substrate, can be produced at relatively low cost compared with full surface etch structures.

Heating by laser irradiation of the specified etch projecting ends can be implemented very selectively by location.

A polishing step, in which the polishing of at least one outer surface of the optical raw element to a desired polarization influence is done after joining and before the removal of the layer thickness at the location of specified individual elements, makes exact presetting of the polarizing effect of the remaining individual elements possible.

By additional material removal of the layer thickness of the polarization formation substrate at the location of further specified individual elements to a specified residual layer thickness of the polarization formation substrate, individual elements with further combinations of bundle-forming and polarizing effect can be produced, though with etch depth imprecision. For instance, the diffractive optical element which is produced in this way can then have three different types of individual elements, each with specified bundle-forming and polarizing effect.

By a joining step, in which the optical raw element is joined to a further optically doubly refracting polarization formation substrate to form an optical multilayer raw element, diffractive optical elements can be produced with individual elements with further combinations of bundle-forming and optical effects, without having to accept the problem of etch depth imprecision. The individual substrate layers of such a multilayer substrate can be joined by matchingly thrusting both substrates jointly together.

In certain embodiments, the disclosure provides a diffractive optical element produced according to a method described. Such a diffractive element can have the advantages which were stated above in relation to the production method.

In some embodiments, the disclosure features an illumination optical system with the diffractive optical element produced according to the disclosure, and a microlithography projection exposure system with such an illumination optical system.

In certain embodiments, the disclosure provides an illumination optical system having at least one diffractive optical element described above and a microlithography projection exposure system with the illumination optical system described above. Its advantages correspond to those which were given above in relation to the diffractive optical element and its production method.

In certain embodiments, the disclosure provides a production method for a micro-electronic component which uses the advantages of the diffractive optical element which is produced according to the disclosure. The method can include:

coating a wafer at least in sections with a light-sensitive layer, projecting a structure on a provided reticle with the microlithography projection exposure system described above onto the wafer, processing the exposed wafer to form the micro-electronic component.

BRIEF DESCRIPTION OF THE DRAWINGS

Embodiments of the disclosure is explained in more detail below on the basis of the drawings, in which.

DETAILED DESCRIPTION

Figure 1:
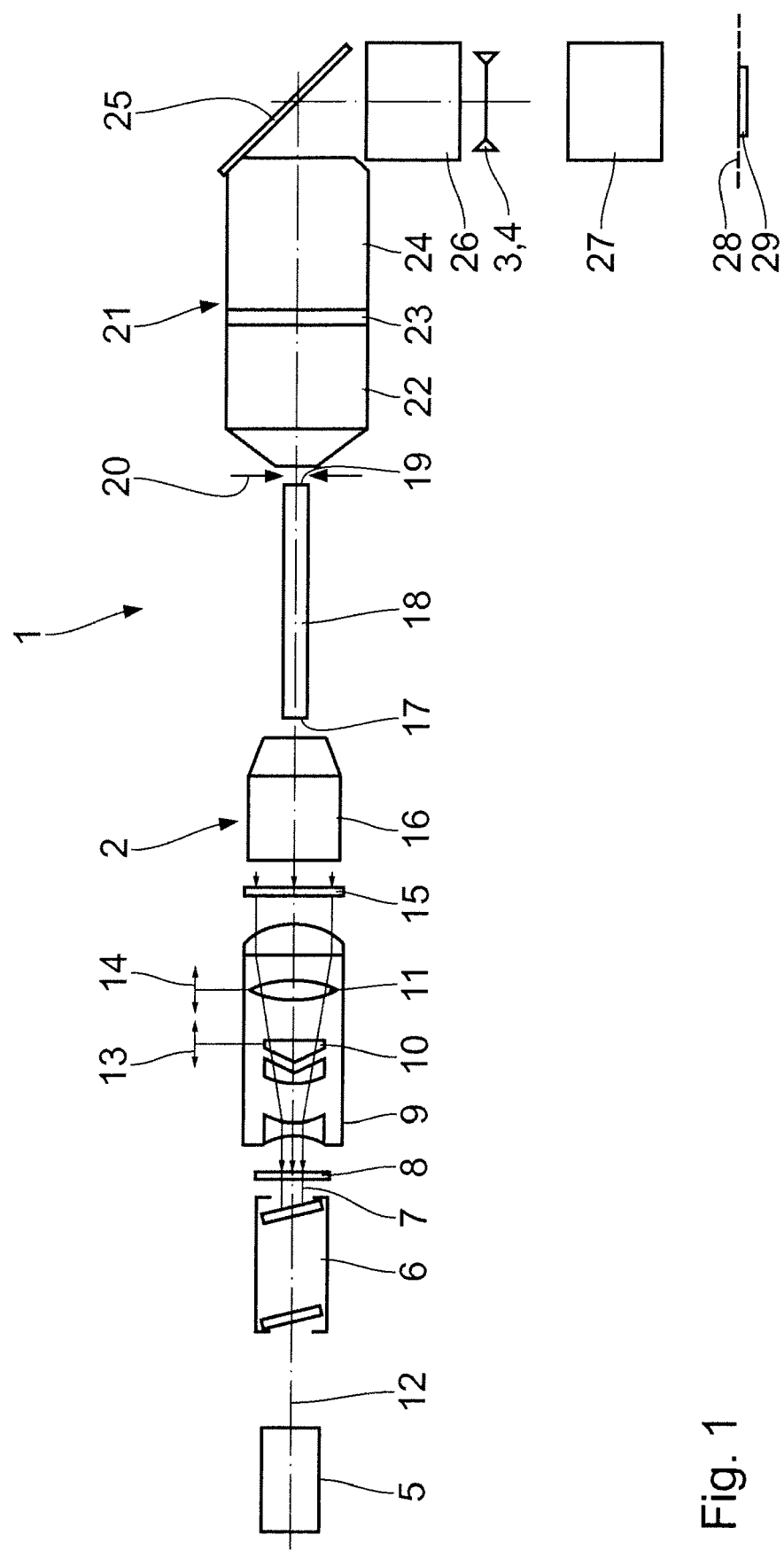
FIG. 1 shows a schematic overview of a microlithography projection exposure system with an illumination optical system which contains a diffractive optical element.

A microlithography projection exposure system 1 has an illumination system with an illumination optical system 2 to illuminate a defined illumination field 3 at the location of a reticle 4, which represents the master which is to be projected for production of micro-structured or micro-electronic components.

As the light source 5 for the illumination system, a laser in the deep ultraviolet (DUV) is used. This can be an ArF excimer laser. Other DUV sources are also possible.

A beam widener 6, e.g. a mirror arrangement known from DE-A 41 24 311, is used for coherence reduction and to generate a widened, collimated, rectangular cross-section of an illumination beam 7.

A first diffractive optical grid element (DOE) 8, which can be produced with the method according to the disclosure and is described in more detail below, is arranged in an object plane of an objective 9. The objective 9 is in the form of a condenser, and includes an Axicon pair 10 and a lens 11 with positive focal length. The distance of the Axicon elements of the Axicon pair 10 from each other and the position of the lens 11 are adjustable along an optical axis 12 of the illumination optical system 2, as indicated in FIG. 1 by double arrows 13, 14. The objective 9 therefore represents a zoom objective.

In an exit pupil plane of the objective 9, a second diffractive optical grid element (DOE) 15, which can also be produced by the method according to the disclosure and is described below, is arranged.

A coupling optical system 16 downstream from the second DOE 15 transmits the illumination light onto an entry surface 17 of a glass rod 18, which mixes and homogenises the illumination light by repeated internal reflection. Directly on an exit surface 19 of the glass rod 18 is an intermediate field plane, in which a reticle masking system (REMA), an adjustable field mask, is arranged.

A subsequent objective 21 with lens groups 22, 23, 24, a deflecting mirror 25 and another lens group 26 maps the intermediate field plane of the REMA 20 onto the reticle 4. The objective 21 has an internal pupil plane.

A projection objective 27 maps the plane in which the surface, which is to be projected, of the reticle 4 lies into an image plane 28, in which a surface, which is to be exposed, of a wafer 29, which itself has a coating which is sensitive to the illumination light, is arranged.

The various objectives of the projection exposure system 1 are shown schematically in FIG. 1 as refractive objectives. They can also be catadioptric or reflective objectives.

With the first DOE 8, a defined intensity distribution can be set at the location of the second DOE 15, so that a specified so-called illumination setting is generated, e.g. a dipole, quadrupole, annular or conventional setting. The second DOE 15 introduces a divergence distribution with an aspect ratio corresponding to the aspect ratio of the entry surface 17 of the glass rod 18, so that the field distribution at the entry surface 17 corresponds exactly to its shape and size.

Figure 2:
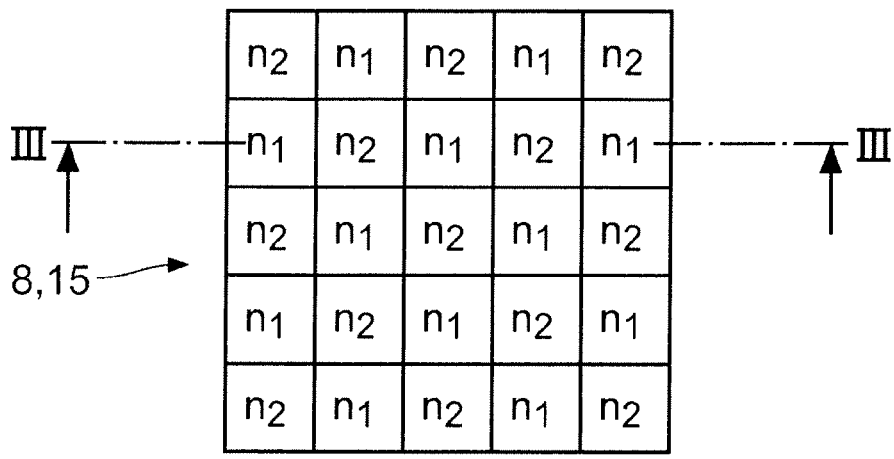
FIG. 2 shows a plan view of a diffractive optical.
Figure 3:
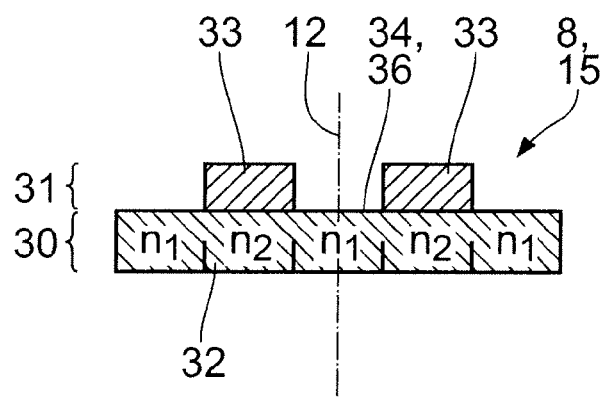
FIG. 3 shows a cross-section according to Line III-III in FIG. 2.

FIGS. 2 and 3 show an example for DOEs 8, 15.

The DOEs 8, 15 are built in two layers, and have a bundle formation layer 30 (shown underneath in FIG. 3), and a polarization formation layer 31 (shown on top in FIG. 3).

Figure 5:
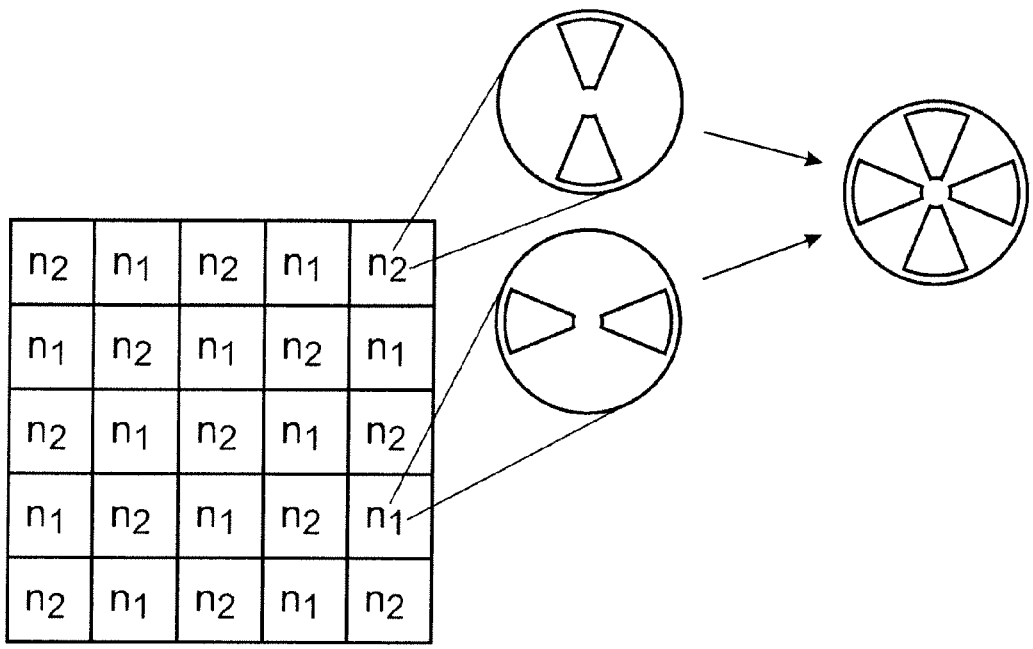
FIG. 5 shows a plan view of the optical raw element according to FIG. 4.
Figure 6:
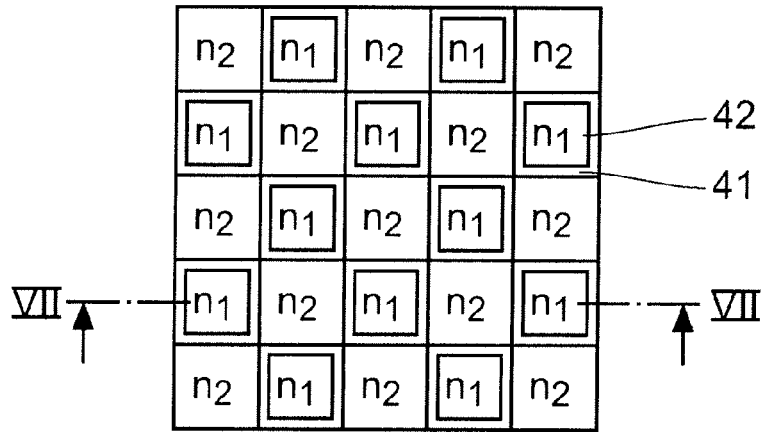
FIG. 6 shows a plan view of the raw element according to FIGS. 4 and 5 in the course of the further production method.

The bundle formation layer 30 has on its free surface 32 a computer-generated hologram (CGH) structure with individual grid elements $n_1$ and $n_2$. As illustrated in FIG. 5, the grid elements $n_1$ generate a dipole illumination with a dipole axis (x-dipole) which is horizontal in FIG. 5. The grid elements $n_2$ generate a dipole illumination with a dipole axis (y-dipole) which is vertical in FIG. 5. The grid elements $n_1$ and $n_2$ alternate in the DOEs 8, 15 like the black and white fields of a chessboard. In the superposition, the DOE 8, 15 therefore generates a quadrupole illumination, as shown on the far right of FIG. 5. This can be used to generate a quadrupole illumination setting, for instance.

The polarization formation layer 31 has individual polarization grid elements 33, which are arranged exactly on the bundle formation grid elements $n_2$ and agree with the bundle formation grid elements $n_2$ in both their position and their aperture. The polarization grid elements 33 meet each other at their corners like, for instance, the black fields of a chessboard. Between them, so corresponding to the location of the white fields of the chessboard, there are free spaces, so that there an opposed surface 34 of the bundle formation layer 30 opposite the surface 32 is freely accessible.

The polarization grid elements 33 are of an optically polarization-active, in particular an optically doubly refracting, material, and/or an optically active material, and influence the polarization, in particular the polarization direction of the illumination light which passes through the DOE 8, 15. An optical axis of the material of the polarization grid elements 33 can be arranged perpendicularly to the optical axis 12 of the illumination optical system 2, parallel to the optical axis 12 of the illumination optical system 2 or at a specified angle to it.

The bundle formation layer 30 is of a material which is not doubly refracting, i.e. is optically homogeneous.

Figure 4:
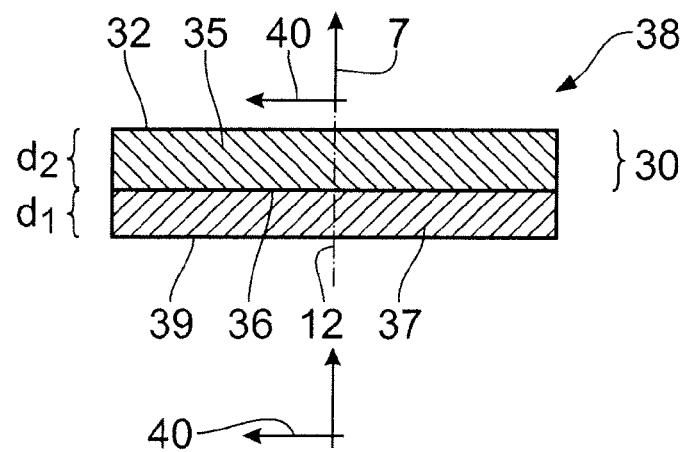
FIG. 4 shows a side view of an optical raw element in the course of the method of producing the diffractive optical element.

The DOE 8, 15 according to FIG. 2 or 3 is produced as follows:

First a bundle formation substrate 35 (shown on top in FIG. 4) is polished on one joining side 36, resulting in the optically polished opposed surface 34 there. The bundle formation substrate 35 is then joined to an optically doubly refracting polarization formation substrate 37 to form an optical raw element 38. The two substrates 35, 37 can be joined by matchingly thrusting both substrates jointly together. This can bond (e.g., chemically bond) substrates 35 and 37 together without the use of an adhesive. Substrates 35 and 37 can be optically coupled. Then, on the surface 32 of the bundle formation substrate 35 (shown on top in FIG. 4), bundle-forming CGH structures are then applied by computer-generated holography, i.e. the bundle formation grid elements $n_1$, $n_2$. When the CGH structures are applied, the bundle formation substrate 35 is subdivided correspondingly to the later individual or grid elements. The situation after the application of the CGH structures is shown in FIGS. 4 and 5. The bundle formation substrate 35 is already in its final form, so that the bundle formation layer 30 is already completed with the layer thickness $d_2$. The CGH structures can be multistage structures, for instance.

Now the polarization formation layer 31 is produced from the polarization formation substrate 37. In preparation, for this purpose a free surface 39 of the polarization formation substrate 37 opposite the surface 32 is polished until it has a layer thickness $d_1$, which is wanted for influencing the polarization. For instance, what may be wanted is that an illumination beam 7 which is polarized perpendicularly to the optical axis 12 of the illumination optical system 2 retains its polarization direction. This situation is shown in FIG. 4, the perpendicular polarization being indicated by arrows 40.

Figure 7:
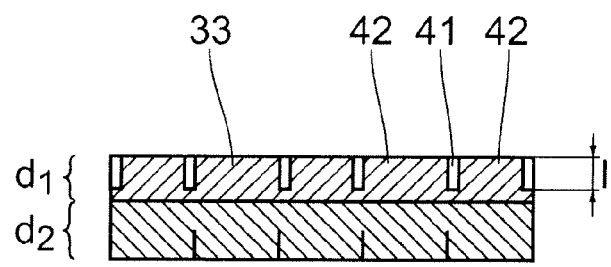
FIG. 7 shows a cross-section according to Line VII-VII in FIG. 6.

After the setting of the layer thickness $d_1$, the polarization formation substrate 37 at the location of the grid elements $n_1$ of the bundle formation layer is removed or stripped as far as the opposed surface 34. This is done by applying etch structures 41 in the form of etch structures running rectangularly round the grid elements $n_1$ in the polarization formation substrate 37 in the form of etched grooves. The etched grooves are applied by a laser. After the etching, which is done to a depth $1 < d_1$ (see FIG. 7), rectangular etch projecting ends 42 remain in the polarization formation substrate 37 at the location of the grid elements $n_1$.

The etch projecting ends 42 are then heated by targeted laser irradiation so that they are completely detached from the opposed surface 34, so that only the polarization grid elements 33 between the etch projecting ends 42 remain in the polarization formation layer 31.

The DOE which is produced in this way has two different types of individual elements, which are arranged like the white and black fields of a chessboard. The bundle formation grid elements $n_1$ are one type of individual elements. Individual elements with the combined effect of polarization grid elements 33 and bundle formation grid elements $n_2$ are the other type of individual elements.

In the case of the DOE 8, 15, therefore, x-dipole structures with defined polarization and y-dipole structures with different polarization are generated.

Alternative DOEs which are produced by this method can have more than two types of individual elements, each with different bundle-forming and/or polarizing effect.

In some embodiments (not shown) of the DOE 8, 15, there are polarization grid elements with different polarization effect. As well as the polarization grid elements 33, at specified locations in the polarization formation layer 31 further polarization grid elements are generated by the polarization formation substrate 37 at these further polarization grid elements not being stripped completely as far as the opposed surface 34, but as far as a specified residual layer thickness of the polarization formation layer 31. This residual layer thickness can be, for instance, $d_1-1$ (see FIG. 7). Because of the lower layer thickness of the further polarization grid elements, they can have a different polarizing effect from the polarization grid elements 33.

To produce another alternative DOE, the optical raw element 38 can be joined to a further optically doubly refracting polarization formation substrate to form an optical multilayer raw element, e.g. a three-layer raw element.

The production method for a DOE, as described above, is not restricted to the chessboard example of the arrangement of the grid elements $n_1$, $n_2$. The DOE can alternatively have a row-wise or column-wise stripe arrangement of first stripe elements, corresponding to the grid elements $n_1$, and second stripe elements, corresponding to the grid elements $n_2$. The first and second stripe elements, like the grid elements $n_1$, $n_2$, have different effects on the illumination beam which passes through them. The stripe elements can differ in their layer thickness d and in their stripe width.

Another variant of a diffractive optical element, the plan view of which corresponds to that of FIG. 2 and the principal cross-section of which corresponds to that of FIG. 3, can be produced from a one-piece optical raw element. The associated production method is described below on the basis of FIGS. 2 and 3. First there is a substrate with a layer thickness $d_1+d_2$. This substrate is in one piece and of an optically polarization-active material. At the location of individual elements $n_1$, $n_2$, which are specified using a corresponding subdivision, e.g. using a marking, the optical raw element is then stripped to a specified depth $d_1$. Assuming an appropriate arrangement of the individual elements to be produced, first parallel fins with a course perpendicular the drawing plane of FIG. 3 and a cross-section corresponding to that of the grid elements 33 in FIG. 3 can be produced. The cross-section of the one-piece substrate which is produced in this way then differs from that of FIG. 3 only in that there is no separation between two substrates.

After the first removal or stripping step, in which the fins were produced, in a second stripping step the fins are then stripped in sections, to form the individual elements $n_1$, $n_2$ along the fins. In the second stripping step, therefore, the fins are interrupted along specified sections.

On the side of the optical raw element opposite the individual elements which are produced in this way by stripping, bundle-forming CGH structures can then also be applied, as explained above.

In addition to the one-piece component which is produced in this way from the optical raw element, a further diffractive optical component can be provided, the two components complement each other to the DOE. The two components are arranged at a short distance from each other in the beam path of the illumination system.

What is claimed is:

1. A method comprising:
   a) optically polishing a surface of a first substrate;
   after a), b) joining the optically polished surface of the first substrate to a second substrate, the second substrate comprising an optically polarization-active material;
   after b), c) forming multiple adjacently arranged elements into the first substrate; and
   after c), d) removing portions of the second substrate at locations corresponding to the elements,
   wherein, for each of the elements, when a bundle of light is incident on the element, the element has a bundle forming effect on a part of the bundle of light.

2. The method according to claim 1, wherein c) comprises:
   generating fins in the first substrate; and
   stripping the fins in sections.

3. The method according to claim 1, wherein the first substrate is joined to the second substrate by matchingly thrusting both substrates jointly together.

4. The method according to claim 1, wherein d) comprises:
forming etch structures in the second substrate, the etch structures having etch projecting ends therebetween; and
heating the etch projecting ends until portions of the second substrate are detached from the first substrate.

5. The method according to claim 4, wherein the etch structures are located along the periphery of the portions of the second substrate that are detached by the heating.

6. The method according to claim 4, wherein heating comprises laser irradiation.

7. The method according to claim 1, further comprising, after b) and before d), polishing of an outer surface of the first and second substrates to a achieve a desired thickness of the first and second substrates.

8. The method according to claim 1, further comprising reducing the layer thickness of the second substrate.

9. The method according to claim 1, further comprising joining the first and second substrates to a third substrate, the third substrate comprising an optically doubly refracting material.

10. A diffractive optical element produced according to a method according to claim 1.

11. A system, comprising:
at least one diffractive optical element produced according to a method according to claim 1,
wherein the system is an illumination optical system.

12. A system, comprising:
an illumination optical system comprising at least one diffractive optical element produced according to claim 1,
wherein the system is a microlithography projection exposure system.

13. A method, comprising:
using a microlithography projection exposure system to form a micro-electronic component, the microlithography projection exposure system comprising an illumination system comprising at least one diffractive optical element produced according to claim 1.

* * * * *

UNITED STATES PATENT AND TRADEMARK OFFICE
CERTIFICATE OF CORRECTION

| | | |
|---|---|---|
| PATENT NO. | : 8,259,392 B2 | Page 1 of 1 |
| APPLICATION NO. | : 12/030646 | |
| DATED | : September 4, 2012 | |
| INVENTOR(S) | : Harald Volkenandt | |

It is certified that error appears in the above-identified patent and that said Letters Patent is hereby corrected as shown below:

<u>Column 2,</u>
Line 18, delete "pre-ceding" and insert --preceding--

<u>Column 2,</u>
Line 30, delete "pre-ceding" and insert --preceding--

<u>Column 2,</u>
Line 33, delete "de-scribed" and insert --described--

<u>Column 6,</u>
Line 46, delete "refracting," and insert --refracting--

<u>Column 9,</u>
Line 13, after "to" delete "a"

Signed and Sealed this
Twenty-third Day of October, 2012

David J. Kappos
*Director of the United States Patent and Trademark Office*